US011025252B2

(12) United States Patent
Kumar et al.

(10) Patent No.: US 11,025,252 B2
(45) Date of Patent: Jun. 1, 2021

(54) CIRCUIT FOR DETECTION OF SINGLE BIT UPSETS IN GENERATION OF INTERNAL CLOCK FOR MEMORY

(71) Applicant: STMicroelectronics International N.V., Geneva (CH)

(72) Inventors: Shishir Kumar, Greater Noida (IN); Tanuj Kumar, Noida (IN); Deepak Kumar Bihani, Noida (IN)

(73) Assignee: STMicroelectronics International N.V., Plan-les-Ouates (CH)

( * ) Notice: Subject to any disclaimer, the term of this patent is extended or adjusted under 35 U.S.C. 154(b) by 0 days.

(21) Appl. No.: 16/578,487

(22) Filed: Sep. 23, 2019

(65) Prior Publication Data

US 2020/0099378 A1    Mar. 26, 2020

Related U.S. Application Data

(60) Provisional application No. 62/735,489, filed on Sep. 24, 2018.

(51) Int. Cl.
*H03K 19/003* (2006.01)
(52) U.S. Cl.
CPC ............................... *H03K 19/00315* (2013.01)
(58) Field of Classification Search
CPC .............................................. H03K 19/00315
USPC ............................................................ 326/9
See application file for complete search history.

(56) References Cited

U.S. PATENT DOCUMENTS

| | | | | |
|---|---|---|---|---|
| 5,018,168 | A * | 5/1991 | Matsuoka | H03K 5/05 375/354 |
| 6,065,102 | A * | 5/2000 | Peters | G06F 12/0866 710/107 |
| 6,446,229 | B1 * | 9/2002 | Merrick | G01R 31/318541 714/724 |
| 8,161,367 | B2 * | 4/2012 | Chandra | H03K 19/00392 326/9 |
| 8,185,812 | B2 * | 5/2012 | Das | G06F 11/0721 714/814 |
| 9,268,637 | B2 * | 2/2016 | Gifford | G06F 11/106 |
| 2010/0169752 | A1 * | 7/2010 | Kuenemund | G11C 7/24 714/811 |
| 2012/0223735 | A1 * | 9/2012 | Gulati | H03K 19/007 326/9 |
| 2017/0184664 | A1 * | 6/2017 | Nicolaidis | G01R 31/3172 |

* cited by examiner

*Primary Examiner* — Don P Le
(74) *Attorney, Agent, or Firm* — Crowe & Dunlevy

(57) ABSTRACT

A failure determination circuit includes a latch circuit that receives an internal clock from a clock latch that rises in response to an external clock rising. In response to a rising edge of the external clock, the circuit generates a rising edge of a fault flag. In response to a rising edge of the internal clock if it occurs, the fault flag falls. The fault flag is then latched. The latched fault flag indicates a single bit upset in the clock latch if the falling edge of the fault flag was not generated prior to latching, if the clock latch is in an active mode, and indicates a single bit upset in the clock latch if the falling edge of the fault flag was generated prior to latching, if the clock latch is in an inactive mode.

25 Claims, 7 Drawing Sheets

CIRCUIT FOR DETECTION OF SINGLE BIT UPSETS IN GENERATION OF INTERNAL CLOCK FOR MEMORY

RELATED APPLICATION

This application claims priority to U.S. Provisional Application For Patent No. 62/735,489, filed Sep. 24, 2018, the contents of which are incorporated by reference to the maximum extent allowable under the law.

TECHNICAL FIELD

This application is directed to the field of memory cells and, in particular, to a circuit for detection of a single bit upset in a latch that generates an internal clock for use in self-timed memory cells.

BACKGROUND

Latches are used for a variety of functions in digital systems. A typical latch 1 is shown in FIG. 1, and is comprised of a first tri-state inverter 2, an inverter 3, and a second tri-state inverter 4. The tri-state inverter 2 receives the input signal IN of the latch, and is enabled by the clock signal CK. The inverter 3 is coupled to the output of the tri-state inverter 2, and generates the output OUT of the latch. The tri-state inverter 4 is coupled in a positive feedback arrangement with the inverter 3, and is enabled by the clock inverse signal CKB (inverse of the clock signal CK).

When the clock signal CK is at logic high, the tri-state inverter 4 is disabled, and the tri-state inverter 2 is enabled, and inverts the logic level at the input IN, which is then returned to its original state at the output OUT by the inverter 3. When the clock signal CK returns to logic low, the tri-state driver 2 is disabled, and the tri-state driver 4 is enabled. This latches the input IN to the output OUT due to the feedback loop of the inverter 3 and tri-state inverter 4, effectively storing the logic level (bit) from the input IN until the clock signal CK returns to logic high.

If the latch 1 is struck by radiation, the stored single data bit can flip. This error can be referred to as a single bit upset (SBU).

In a self-timed memory, in response to detection of a rising edge of an external clock signal, an internal clock signal is generated and latched until the memory completes a successful operation and an internal reset signal is generated at logic high.

An example clock latch 5 for a memory is shown in FIG. 2, and is comprised of a NAND gate 6 and a tri-state inverter 7. NAND gate 6 receives as input feedback from its output (after inversion by tri-state inverter 7), as well as the reset signal RESET and the clock signal CK. Tri-state inverter 7 is coupled in a positive feedback arrangement with the NAND gate 6, and is enabled by the clock inverse signal CKB. The feedback arrangement and NAND logic creates a set and auto-reset behavior, with an internal clock inverse signal INTCKB (inverse of internal clock signal INTCK) being generated at the output of the NAND gate 6.

Occurrence of a single bit upset error during operation of this clock latch 5 is particularly undesirable. Such potential single bit upsets are now discussed with additional reference to FIG. 3.

A single bit upset can occur during an active cycle (where the memory is enabled, and the clock latch is to generate the internal clock signal INTCK in response to the external clock signal CK), as shown where the rising edge of the clock signal CK pulse 10 and the auto-reset behavior properly generates the internal clock signal INTCK pulse 14 but then another internal clock signal INTCK pulse 15 is spuriously generated due to a radiation strike. Another example of a single bit upset during an active cycle can occur where the rising edge of the clock signal CK pulse 12 begins generation of the internal clock signal INTCK pulse 17 but the pulse quickly drops to logic low without reaching logic high, resulting in a lack of a readable internal clock signal INTCK pulse. A further example of a single bit upset during an active cycle can occur where the rising edge of the clock signal CK pulse 13 begins generation of the internal clock signal INTCK pulse 18, with the pulse reaching logic high but prematurely dropping back to logic low due to improper rising of the reset signal RESET.

These single bit upsets during active cycles can result in a read/write failure or a spurious operation being performed. A single bit upset can also occur during an inactive cycle (where the memory is not enabled), as shown where the rising edge of the clock signal CK pulse 11 results in spurious generation of the internal clock signal INTCK 16 pulse.

These single bit upsets can result in corruption of the memory itself, and of the data stored in the memory. Therefore, it is desirable to be able to detect such single bit upsets so that protective and corrective actions can be taken.

SUMMARY

A first embodiment disclosed herein is a failure determination circuit. The failure determination circuit includes a master and save latch arrangement configured, in an active mode, to: receive an internal clock signal from a clock latch that is intended to rise in response to an external clock signal rising; in response to a rising edge of the external clock signal, generate a rising edge of a fault flag signal; in response to a rising edge of the internal clock signal if the rising edge of the internal clock signal occurs, generate a falling edge of the fault flag signal; and in response to a memory reset signal, latch the fault flag signal. The latched fault signal indicates a single bit upset in the clock latch if the falling edge of the fault flag signal was not generated prior to latching.

The master and slave latch arrangement is configured, in an inactive mode, to: in response to a rising edge of the external clock signal, generate a rising edge of a fault flag signal; in response to a rising edge of the internal clock signal if the rising edge of the internal clock signal occurs, generate a falling edge of the fault flag signal; and in response to a falling edge of the internal clock signal if the rising edge of the internal clock signal occurred, latch the fault flag signal. The latched fault signal indicates a single bit upset in the clock latch if the falling edge of the fault flag signal was generated prior to latching.

The master and slave latch arrangement includes: a first latch having a first input receiving an inverse of the external clock signal, a second input receiving the internal clock signal, and an output; an inverter coupled to the output of the first latch; and a second latch having a non-inverting enable terminal receiving a signal based upon the inverse of the external clock signal and an inverse of the output of the first latch, an inverting enable terminal receiving a signal based upon the internal clock signal, an input coupled to receive output from the inverter, and an output.

The first latch is constructed from NOR logic, and the second latch is constructed from NOT logic.

The second latch includes: a first tri-state inverter having an inverting enable terminal receiving the inverse of the external clock signal, a non-inverting enable terminal receiving the internal clock signal, and an input coupled to receive output from the inverter; a first inverter having an input coupled to output of the first tri-state inverter; and a second tri-state inverter having an inverting enable terminal, a non-inverting enable terminal, an input coupled to output of the first inverter, and an output coupled to input of the first inverter.

The second latch includes: a PMOS transistor having a source coupled to a supply node, a drain coupled to the inverting enable terminal of the second tri-state inverter, and a gate coupled to the internal clock signal; a first NMOS transistor having a drain coupled to the non-inverting enable terminal of the second tri-state inverter, a source coupled to ground, and a gate coupled to receive output from the inverter that receives output of the first latch; a second NMOS transistor having a drain coupled to the non-inverting enable terminal of the second tri-state inverter, a source coupled to ground, and a gate coupled to the inverse of the external clock signal; and an inverter receiving input from the first inverter and producing the fault flag signal at its output.

A second embodiment is directed to a failure determination circuit that detects a single bit upset in a clock latch. The clock latch receives an external clock signal and generates an internal clock signal therefrom. The failure determination circuit includes: a first latch configured to generate a first signal at logic high when the internal clock signal is at logic low and the external clock signal is at logic high, and at logic low when the internal clock signal is at logic high; and a second latch configured to generate a fault flag signal at logic high when the first signal is at logic high, to generate the fault flag signal at logic low when the first signal is at logic low, and to latch when the internal clock signal is at logic low. The fault flag signal being at logic high upon latching of the second latch and the clock latch being in an active mode indicates presence of a single bit upset in the clock latch. The fault flag signal being at logic low upon latching of the second latch and the clock latch being in an inactive mode indicates presence of a single bit upset in the clock latch.

The second latch includes: a first tri-state inverter having an inverting enable terminal receiving the inverse of the external clock signal, a non-inverting enable terminal receiving the internal clock signal, and an input coupled to receive an inverted version of the first signal; a first inverter having an input coupled to output of the first tri-state inverter; a second tri-state inverter having an inverting enable terminal, a non-inverting enable terminal, an input coupled to output of the first inverter, and an output coupled to input of the first inverter; a PMOS transistor having a source coupled to a supply node, a drain coupled to the inverting enable terminal of the second tri-state inverter, and a gate coupled to the internal clock signal; a first NMOS transistor having a drain coupled to the non-inverting enable terminal of the second tri-state inverter, a source coupled to ground, and a gate coupled to receive output from the inverter that receives output of the first latch; a second NMOS transistor having a drain coupled to the non-inverting enable terminal of the second tri-state inverter, a source coupled to ground, and a gate coupled to the inverse of the external clock signal; and an inverter receiving input from the first inverter and producing the fault flag signal at its output.

The first latch includes first and second NOR gates. The first NOR gate has inputs coupled to the inverse of the external clock signal and to the output of the second NOR gate, and an output. The second NOR gate has inputs coupled to the internal clock signal and to the output of the first NOR gate, and an output. A third inverter is coupled to receive input from the output of the second NOR gate and provides output to the second latch.

A third embodiment is directed to a failure determination circuit that detects a single bit upset in a clock latch. The clock latch receives an external clock signal and generates an internal clock signal therefrom. The failure determination circuit includes: a SR latch having a set input receiving an inverse of the external clock signal, a reset input receiving the internal clock signal, and an output; an inverter coupled to the output of the SR latch; and a static latch having a inverting enable terminal receiving a signal based upon the inverse of the external clock signal and an inverse of the output of the SR latch, a non-inverting enable terminal receiving a signal based upon the internal clock signal, an input coupled to receive output from the inverter, and an output.

An inverter receives input from the output of the static latch and produces a fault flag signal as output. The fault flag signal being at logic high upon latching of the static latch and the clock latch being in an active mode indicates presence of a single bit upset in the clock latch, and the fault flag signal being at logic low upon latching of the static latch and the clock latch being in an inactive mode indicates presence of a single bit upset in the clock latch.

The SR latch is constructed from NOR logic, and the static latch is constructed from NOT logic.

A fourth embodiment is directed to an electronic device with: a first latch receiving as input an internal clock signal for a memory and an inverse of an external clock signal from which an internal clock signal was generated; a first inverter having an input coupled to output of the first latch; and a second latch. The second latch includes: a first tri-state inverter having an inverting enable terminal receiving the inverse of the external clock signal, a non-inverting enable terminal receiving the internal clock signal, and an input coupled to output of the first inverter; a second inverter having an input coupled to output of the first tri-state inverter; a second tri-state inverter having an input coupled to output of the second inverter and an output coupled to input of the second inverter; a PMOS transistor having a source coupled to a supply node, a drain coupled to an inverting enable terminal of the second tri-state inverter, and a gate coupled to the internal clock signal; a first NMOS transistor having a drain coupled to a non-inverting enable terminal of the second tri-state inverter, a source coupled to ground, and a gate coupled to the output of the first inverter; and a second NMOS transistor having a drain coupled to the non-inverting enable terminal of the second tri-state inverter, a source coupled to ground, and a gate coupled to the inverse of the external clock signal. A third inverter has an input coupled to the output of the second inverter and an output for the circuit.

The first latch includes first and second NOR gates. The first NOR gate has inputs coupled to the inverse of the external clock signal and to the output of the second NOR gate, and an output. The second NOR gate has inputs coupled to the internal clock signal and to the output of the first NOR gate, and an output coupled to the input of the first inverter.

The second tri-state inverter has an inverting enable terminal coupled to a second node and a non-inverting enable terminal coupled to a first node.

The second latch also includes: a first PMOS transistor having a source coupled to a power supply node, a drain coupled to the second node, and a gate coupled to receive the internal clock signal; a first NMOS transistor having a drain coupled to the first node, a source coupled to ground, and a gate coupled to the output of the first inverter; and a second NMOS transistor having a drain coupled to the first node, a source coupled to ground, and a gate coupled to receive the inverse of the external clock signal.

A fifth embodiment is directed to a method of determining presence of a single bit upset in a clock latch. The method includes receiving a next rising edge of an external clock signal at the clock latch. In response to the rising edge of the external clock signal, the method includes intending to generate a rising edge of an internal clock signal when the clock latch is in an active mode (and not intending to generate a rising edge of the internal clock signal when the clock latch is in an inactive mode), and generating a rising edge of a fault flag signal. In response to a rising edge of the internal clock signal if the rising edge of the internal clock signal occurs, a falling edge of the fault flag signal is generated. The fault flag signal is latched. The latched fault signal indicates a single bit upset in the clock latch if the falling edge of the fault flag signal was not generated prior to latching, if the clock latch is in the active mode. The latched fault signal indicates a single bit upset in the clock latch if the falling edge of the fault flag signal was generated prior to latching, if the clock latch is in the inactive mode.

Also disclosed herein is a circuit having a first latch receiving as input an internal clock signal for a memory and an inverse of an external clock signal from which an internal clock signal was generated. A first inverter has an input coupled to output of the first latch. A second latch includes: a first tri-state inverter having an inverting enable terminal receiving the inverse of the external clock signal, a non-inverting enable terminal receiving the internal clock signal, and an input coupled to output of the first inverter; a second inverter having an input coupled to output of the first tri-state inverter; a second tri-state inverter having an input coupled to output of the second inverter and an output coupled to input of the second inverter; a first transistor having a first conduction terminal coupled to a supply node, a second conduction terminal coupled to an inverting enable terminal of the second tri-state inverter, and a control terminal coupled to the internal clock signal; a second transistor having a first conduction terminal coupled to a non-inverting enable terminal of the second tri-state inverter, a second conduction terminal coupled to ground, and a control terminal coupled to the output of the first inverter; and a third transistor having a first conduction terminal coupled to the non-inverting enable terminal of the second tri-state inverter, a second conduction terminal coupled to ground, and a control terminal coupled to the inverse of the external clock signal.

The first latch may include first and second logic gates, with the first logic gate having inputs coupled to the inverse of the external clock signal and to the output of the second logic gate, and an output. The second logic gate may have inputs coupled to the internal clock signal and to the output of the first logic gate, and an output coupled to the input of the first inverter.

The second tri-state inverter may have an inverting enable terminal coupled to a second node and a non-inverting enable terminal coupled to a first node. The second latch may also include: a fourth transistor having a second conduction terminal coupled to a power supply node, a first conduction terminal coupled to the second node, and a control terminal coupled to receive the internal clock signal; a fifth transistor having a first conduction terminal coupled to the first node, a second conduction terminal coupled to ground, and a control terminal coupled to the output of the first inverter; and a sixth transistor having a first conduction terminal coupled to the first node, a second conduction terminal coupled to ground, and a control terminal coupled to receive the inverse of the external clock signal.

A third inverter may have an input coupled to the output of the second inverter and an output for the circuit.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Failure Detection Circuit

Figure 1:
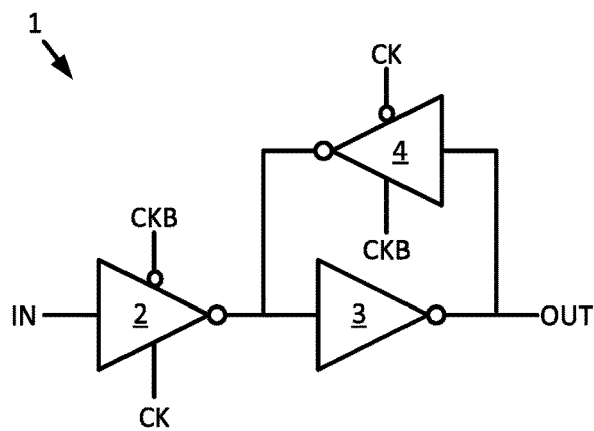
FIG. 1 is a schematic block diagram of a known latch.
Figure 2:
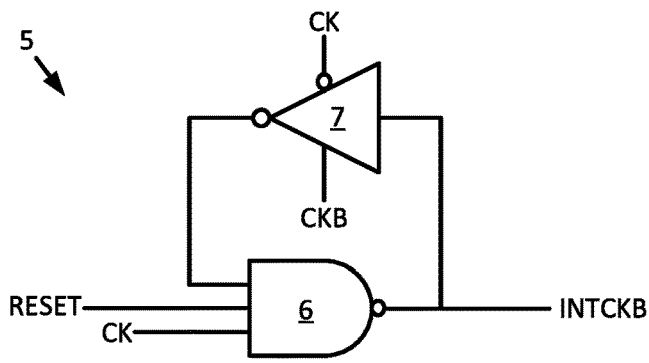
FIG. 2 is a schematic block diagram of a known clock latch for generating an internal clock signal for a self-timed memory.
Figure 3:
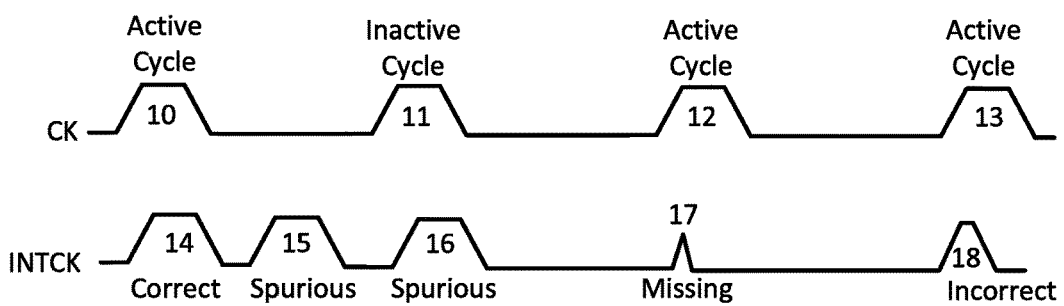
FIG. 3 is a timing diagram showing proper and improper operation of the latch of FIG. 2.
Figure 4:
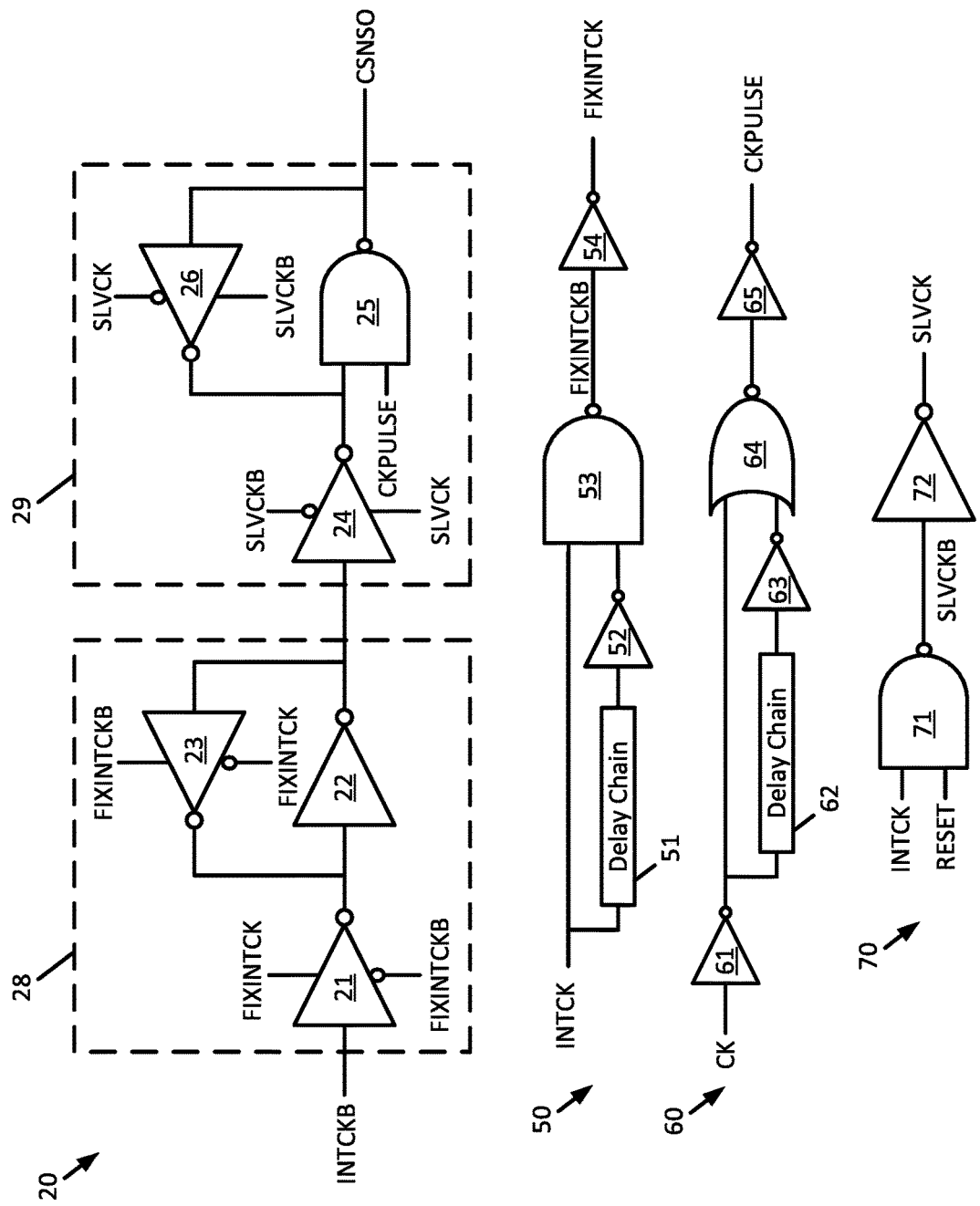
FIG. 4 is a schematic block diagram of a known failure detection circuit for determining whether a clock latch is operating properly or improperly.

A failure detection circuit 20 for detecting single bit upsets in a clock latch is shown in FIG. 4. The circuit 20 includes master and slave latches 28 and 29. Master latch 28 is comprised of tri-state inverter 21, inverter 22, and tri-state inverter 23. Tri-state inverter 21 is enabled by the FIXINTCKB and FIXINTCK signals, receives the internal clock inverse signal INTCKB (generated, for example, by the clock latch 5 of FIG. 3) as input, and has its output coupled to inverter 22. Tri-state inverter 23 is enabled by the FIXINTCK and FIXINTCKB signals, and is coupled in a positive feedback arrangement with the inverter 22.

The slave latch 29 is comprised of tri-state inverter 24, NAND gate 25, and tri-state inverter 26. The tri-state inverter 24 is enabled by the SLVCK and SLVCKB signals, receives its input from the output of the master latch 28, and provides its output to the NAND gate 25. The NAND gate 25 receives the CKPULSE signal and produces the fault flag CSNSO at its output. The tri-state inverter 26 is enabled by the SLVCKB and SLVCK signals, and is coupled in a positive feedback arrangement between the output of the NAND gate 25 and the input of NAND gate 25 that is coupled to inverter 24.

Generation of the FIXINTCK, CKPULSE, and SLVCK signals is now described. The logic 50 for generating the FIXINTCK signal includes delay chain 51, inverter 52, NAND gate 53, and inverter 54. The delay chain 51 receives the INTCK signal, and passes a delayed version of the INTCK signal to inverter 52, which provides an inverted and delayed version of the INTCK signal to the NAND gate 53, which also receives the INTCK signal as input, and provides its output as the FIXINTCKB signal to inverter 54, which inverts the FIXINTCKB signal to generate the FIXINTCK signal.

The logic 60 for generating the CKPULSE signal includes inverter 61, delay chain 62, inverter 63, NOR gate 64, and inverter 65. The inverter 61 receives the external clock signal CK, and provides its output to the NOR gate 64 and the delay chain 62. The inverter 63 receives the output from the delay chain 62, and inverts the delayed version of the external clock signal for input to the NOR gate 64. The output of the NOR gate 64 is inverted by the inverter 65 to produce the CKPULSE signal.

Figure 5:
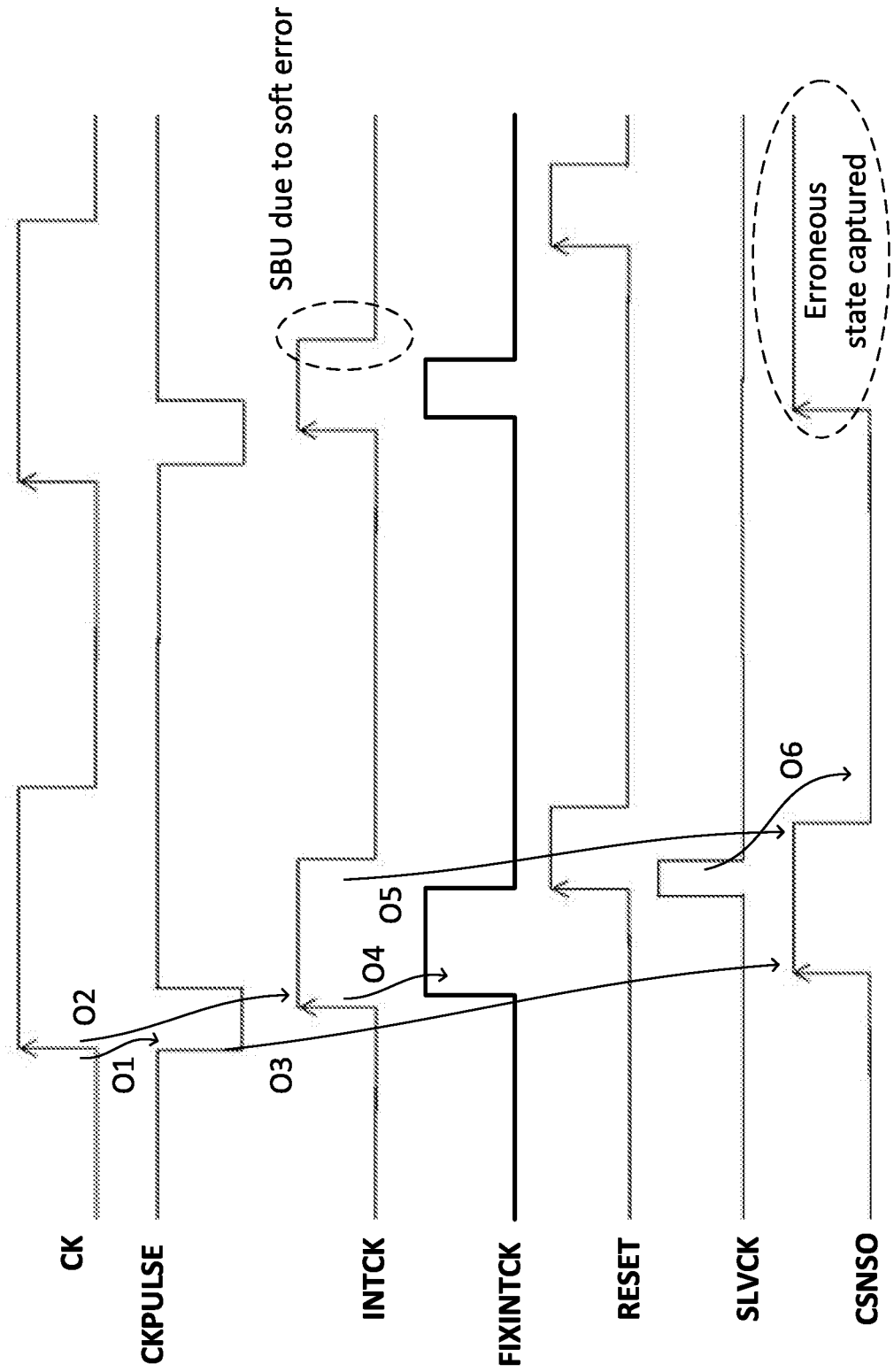
FIG. 5 is a timing diagram of the failure detection circuit of FIG. 4 during an active cycle and while detecting a single bit upset.

As can be appreciated from the timing diagram of FIG. 5, when the external clock signal CK transitions to logic high, the CKPULSE signal transitions to logic low and remains at logic low until the change to the logic level of the external clock signal CK propagates through the delay chain 62.

Referring back to FIG. 4, the logic 70 for generating the SLVCK signal includes NAND gate 71 and inverter 72. The NAND gate 71 receives the INTCK signal and a reset signal RESET as input, and generates the SLVCKB signal as output. The inverter 72 inverts the SLVCKB signal to output as the SLVCK signal.

As can be noted in the timing diagram of FIG. 5, the SLVCK signal is logic high when both the INTCK signal and RESET signal are at logic high.

Operation of the circuit 20 of FIG. 4 during the active cycle is now described with additional reference to FIG. 5. Upon the rising edge of CK, CKPULSE is pulled low by the logic 60 as noted by arrow O1, and the internal clock signal INTCK is pulled high as noted by arrow O2. Note that since SLVCK is logic low at this point, data cannot pass from the inverter 22 to the NAND gate 25, so the output of the NAND gate 25 will be controlled by CKPULSE. Therefore, CKPULSE being driven low serves to cause the NAND gate 25 to pull the fault flag CSNSO high as noted by arrow O3, and the feedback through the tri-state inverter 26 maintains the fault flag CSNSO at logic high.

FIXINTCK rises soon after INCK rises as noted by arrow O4. At this point, the tri-state inverter 21 will be enabled because FIXINTCKB is logic low and FIXINTCK is logic high, and the tri-state inverter 23 will be disabled because FIXINTCK is logic high and FIXINTCKB is logic low. Therefore, at this point, the logic level of the internal clock inverse signal INTCKB will be output by the inverter 22.

Upon RESET rising, since INTCK is still logic high at this point, the SLVCK signal rises, enabling the tri-state inverter 24 and disabling the tri-state inverter 26. Thus, the logic level of the internal clock inverse signal INTCKB will be received by the tri-state inverter 24. Upon FIXINTCK falling, the tri-state inverter 21 will be disabled, and the tri-state inverter 23 will be enabled, latching the value of the internal clock inverse signal INTCKB. As a result, INTCKB is passed by the master latch 28 and then inverted by the tri-state inverter 24 to be received by the NAND gate 25, which then pulls the fault flag CSNSO low as noted by arrow O5.

When SLVCK falls because INTCK falls, the tri-state inverter 24 is disabled and the tri-state inverter 26 is enabled, latching the fault flag CSNSO in its current state as noted by arrow O6, which in this example is logic low, indicating (during an active cycle) that there has been no single bit upset or fault with the clock latch generating INTCK.

In the next cycle shown in FIG. 5, there is a single bit upset in the clock latch, which results in the INTCK signal not having the proper pulse width. As a consequence, there is no time at which INTCK and RESET are both high. As a result, the tri-state inverter 24 is not enabled to invert the internal clock inverse signal INTCKB signal. Therefore, once the fault flag CSNSO rises in response to CKPULSE falling, the fault flag CSNSO remains logic high, and remains latched. This latched logic high value of the fault flag CSNSO (during this active cycle) indicates the single upset has occurred.

Figure 6:
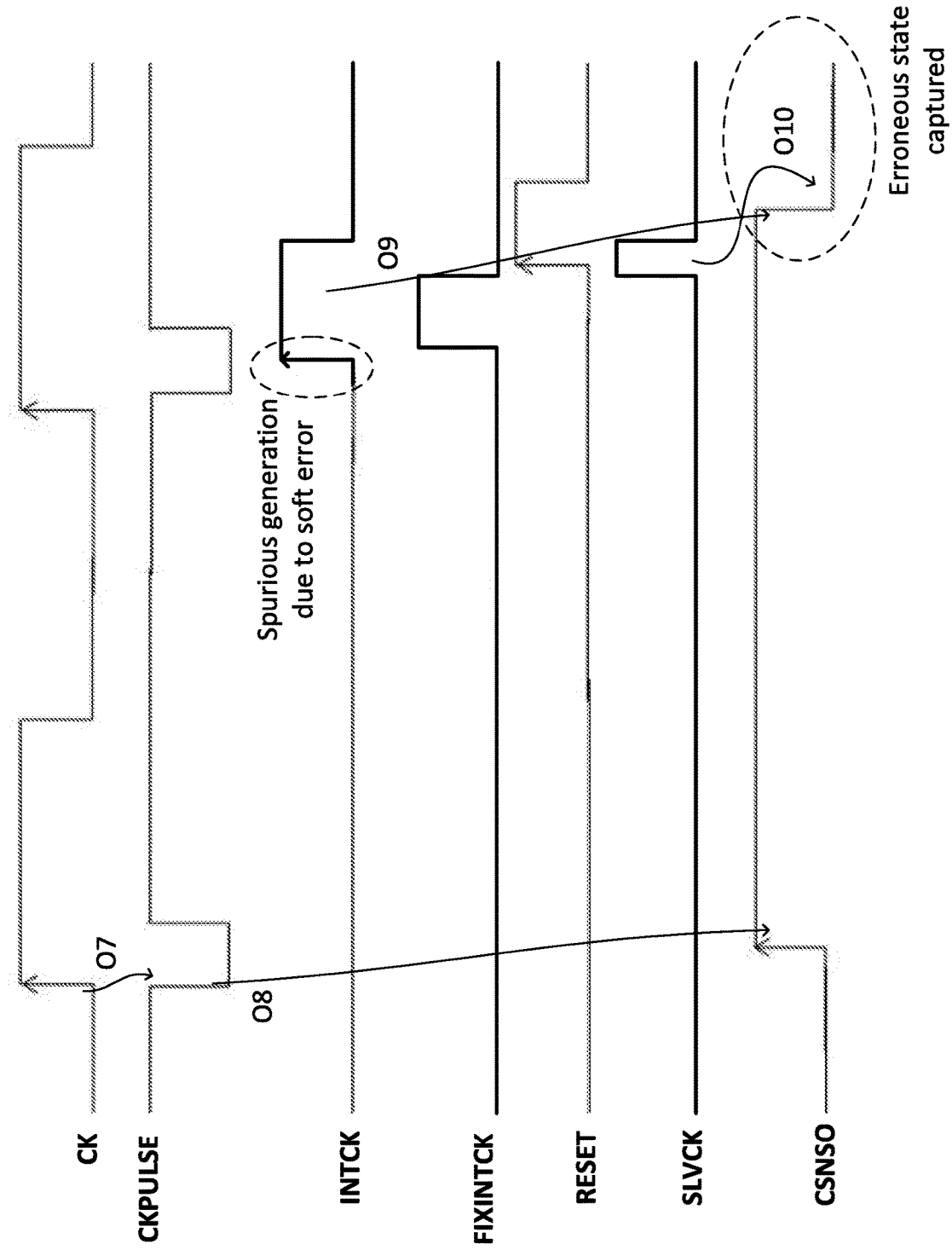
FIG. 6 is a timing diagram of the failure detection circuit of FIG. 4 during an inactive cycle and while detecting a single bit upset.

Shown in FIG. 6 is an inactive cycle, in which the clock latch does not generate the internal clock signal INTCK in response to the external clock signal CK. Once CKPULSE (generated in response to the rising edge of the external clock CK as shown by arrow O7) falls, the fault flag CSNSO rises (as shown by arrow O8). Since SLVCK does not rise, the tri-state inverter 24 is not enabled, and CSNSO stays latched at logic high to indicate proper operation (during this inactive cycle).

An error occurs where a pulse of the internal clock signal INTCK is spuriously generated, as the internal clock signal INTCK is not to be generated during the inactive cycle. The result is the internal clock inverse signal INTCKB being propagated through the master latch 28, and the tri-state inverter 24 being enabled when SLVCK rises, and therefore CSNSO falls due to the NAND logic (as shown by arrow O9) and is then latched (as shown by arrow O10) to indicate presence of a single bit upset.

While the failure detection circuit 20 of FIG. 4 is capable of determining the occurrence of single bit upsets in clock latches, it possesses multiple drawbacks. For example, the use of multiple logic gates, both in the slave latch and in the generation of various control and timing signals, can result in issues of pulse integrity. In addition, the use of the logic gates provides for multiple possible race (metastable) conditions.

Failure Detection Circuit 30

Figure 7:
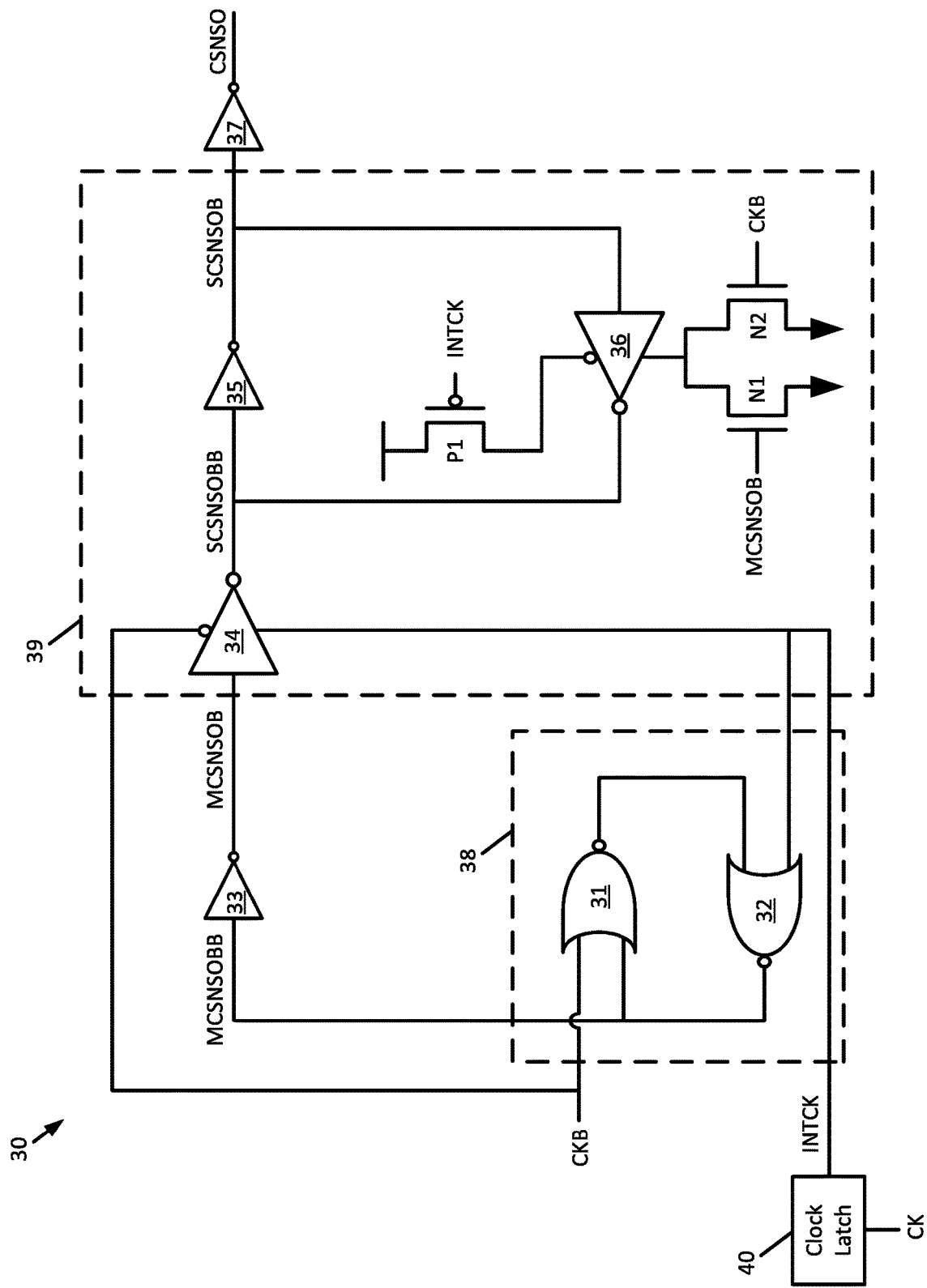
FIG. 7 is a schematic block diagram of an improved failure detection circuit for determining whether a clock latch is operating properly or improperly.

Therefore, a failure detection circuit with improved performance has been developed. With reference to FIG. 7, a failure detection circuit 30 for determining single bit upsets in a clock latch 40 that generates an internal clock signal INTCK for use by a self-timed memory (not shown) is now described. Note that the internal clock signal INTCK clock signal is to be generated by the clock latch 40 in response to the external clock signal CK when the self-timed memory is an "active cycle", and is not to be generated by the clock latch 40 when the self-timed memory is in an "inactive cycle". The failure detection circuit 30 operates to generate a fault flag CSNSO, that when at logic high (during an active cycle of the self-timed memory) indicates presence of a single bit upset, and when at logic low (during an inactive cycle of the self-timed memory) indicates presence of a single bit upset.

The failure detection circuit 30 includes a master latch 38 (which can be considered a set-reset SR latch) and a slave latch 39 (which can be considered a static latch). The master latch 38 includes NOR gate 31 that receives as input a clock inverse signal CKB (the inverse of the external clock signal CK) as well as the output of NOR gate 32. The NOR gate 32 receives as input the internal clock signal INTCK as well as the output of the NOR gate 31, and provides its output signal MCSNSOBB to inverter 33 as input, which provides its output to the slave latch 39 as input.

The slave latch 39 includes tri-state inverter 34 receiving the MCSNSOB signal as input, and having an inverting enable input receiving the clock inverse signal CKB and a non-inverting enable input receiving the internal clock signal INTCK. Note that the tri-state inverter 34 is enabled when either the clock inverse signal CKB is at logic low and/or when the internal clock signal INTCK is at logic high, and is disabled when the clock inverse signal CKB is at logic high and the internal clock signal INTCK is at logic low. When enabled, the tri-state inverter 34 produces the SCSNSOBB signal as input to the inverter 35, which in turn produces the SCSNSOB signal. The inverter 35 provides the SCSNSOB signal to inverter 37, which produces the fault flag CSNSO.

Tri-state inverter 36 is coupled between the input and output of the inverter 35 in a positive feedback arrangement. The tri-state inverter 36 has an inverting enable input coupled to the drain of PMOS transistor P1. The source of PMOS transistor P1 is coupled to a supply node, and the gate of PMOS transistor P1 receives the internal clock signal INTCK. The tri-state inverter 36 has a non-inverting enable input coupled to the drains of NMOS transistors N1 and N2. NMOS transistors N1 and N2 have their sources coupled to ground. NMOS transistor N1 receives the MCSNSOB signal at its gate while NMOS transistor N2 receives the clock inverse signal CKB at its gate. Note that the tri-state inverter 36 is enabled when the internal clock signal INTCK is at logic low, and the clock inverse signal CKB and/or the MCSNSOB signal are at logic high. The tri-state inverter 36 is disabled when either the internal clock signal INTCK is at logic high, and/or when both the clock inverse signal CKB and the MCSNSOB signal are at logic low.

Referring additionally to the timing diagrams of FIGS. 8-9, keeping in mind that (during correct operation) the internal clock signal INTCK rises in response to a rising edge of the external clock signal CK (noted by arrows E0 and E3), and falls when the self-timed memory has completed its operation, the operation of the failure detection circuit 30 will first be discussed in general, and thereafter, discussed in detail.

Figure 8:
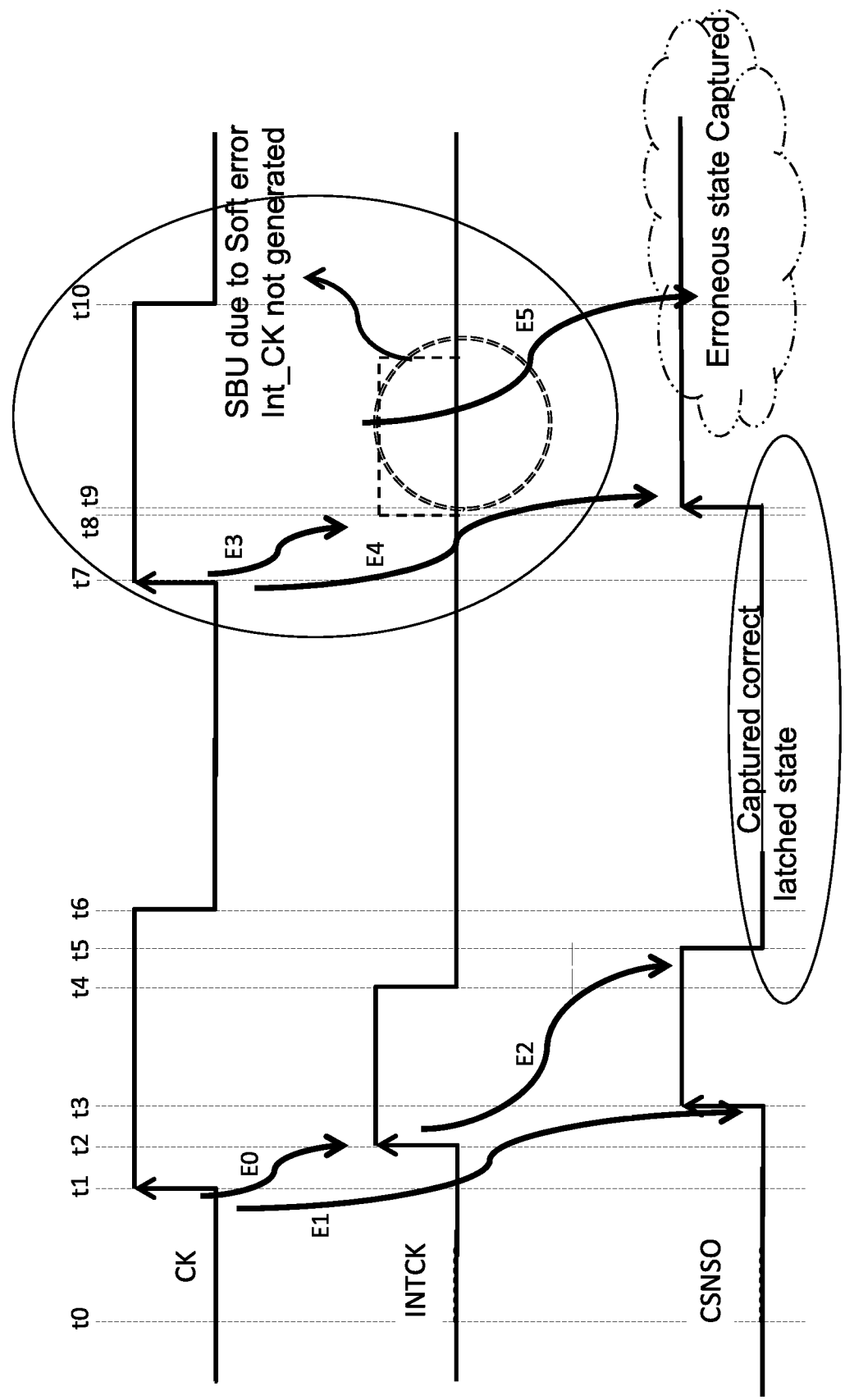
FIG. 8 is a timing diagram of the failure detection circuit of FIG. 7 in operation while detecting a single bit upset during an active cycle.

Failure Detection Circuit 30 Operation During Active Cycle of Self Timed Memory In general, with further reference to FIG. 8, during an active cycle of the self-timed memory where a single bit upset does not occur, the internal clock signal INTCK is generated in response to a rising edge of the external clock signal CK (noted by arrow E0). The failure detection circuit 30 generates a rising edge of the fault flag CSNSO in response to a rising edge of the external clock signal CK (noted by arrow E1), and generates a falling edge of the fault flag CSNSO in response to a rising edge of the internal clock signal CK (noted by arrow E2). The fault flag CSNSO being latched at logic low indicating an absence of an error.

If, however, the internal clock signal INTCK does not rise when it should (noted by arrow E3), the fault flag CSNSO still rises in response to the rising edge of the external clock signal CK (noted by arrow E4) but does not fall when it should (noted by arrow E5) because the rising edge of the internal clock signal INTCK did not occur. Then, the fault flag CSNSO is latched at logic high, indicating that a single bit upset has occurred.

Therefore, when operating during an active cycle of the self-timed memory, in the absence of error, the fault flag CSNSO will be at logic low, and thus, a latched logic low value of fault flag CSNSO indicates proper operation and lack of a single bit upset within the clock latch 40, while a latched logic high value of fault flag CSNSO indicates occurrence of a failure and a single bit upset within the clock latch 40.

Figure 9:
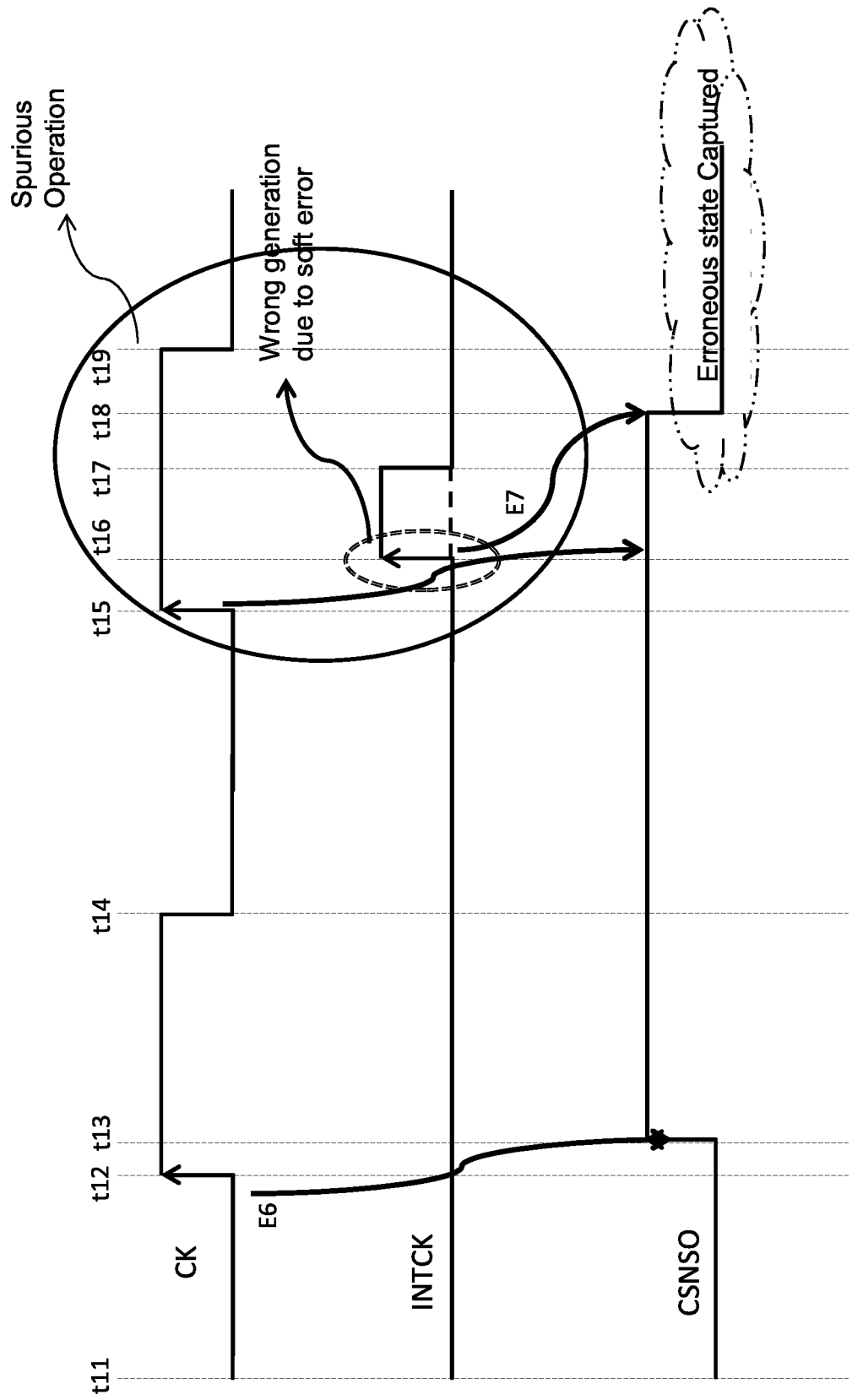
FIG. 9 is a timing diagram showing the failure detection circuit of FIG. 7 in operation while detecting a single bit upset during an inactive cycle.

Failure Detection Circuit 30 Operation During Inactive Cycle of Self Timed Memory Referring now to FIG. 9, in general, during an inactive cycle of the self-timed memory, the failure detection circuit generates a rising edge of the fault flag CSNSO (provided that the fault flag CSNSO was not already high) in response to a rising edge of the external clock signal CK (noted by arrow E6), and the fault flag CSNSO is latched. Therefore, since the internal clock signal INTCK is not intended to rise during an inactive cycle of the self-timed memory, a latched logic high value of the fault flag CSNSO indicates lack of a single bit upset in the clock latch 40 during the inactive cycle.

However, if a rising edge of the internal clock signal INTCK is spuriously and wrongly generated due to a single bit error in the clock latch 40, then the fault flag CSNSO falls in response to the rising edge of the internal clock signal INTCK (noted by arrow E7), and is latched at logic low. Therefore, since the internal clock signal INTCK is not intended to rise during the inactive cycle of the self-timed memory, a latched logic low of the fault flag CSNSO indicates a single bit upset in the clock latch 40 during the inactive cycle.

Hence, while operating during an inactive cycle of the self-timed memory, a latched logic high value of fault flag CSNSO indicates proper operation while a latched logic low value of the fault flag CSNSO indicates occurrence of a failure and a single bit upset within the clock latch 40.

Failure Detection Circuit 30 Operation During Active Cycle of Self Timed Memory Detailed operation when the self-timed memory is an active cycle is now described with additional reference to the timing diagram of FIG. 8. A cycle during which no error occurs is shown between times t0-t6. As can be seen, the external clock signal CK rises to logic high at time t1. The external clock signal CK being at logic high means that its inverse CKB will be at logic low.

Since the external clock signal CK was previously at logic low, this means that its inverse CKB was previously at logic high, meaning that NOR gate 31 will be outputting logic low when the external clock signal CK rises (and its inverse CKB falls) at time t1. The result is that NOR gate 32 outputs logic high as MCSNSOBB to inverter 33, and that the inverter 33 in turn outputs MCSNSOB at logic low. Note that the tri-state inverter 34 is enabled at this time, due to CKB being low, and will output SCNSOBB at logic high. Also, tri-state inverter 36 will remain enabled at this time until the internal clock signal INTCK falls to logic low. Inverter 35 inverts SCSNSOBB as SCSNSOB, and inverter 37 inverts SCSNSOB as CSNO, and thus the fault flag CSNO rises to logic high at time t3 (due to propagation delay).

At time t2, the internal clock signal INTCK rises in response to the rising edge of the external clock signal CK. The internal clock signal INTCK being high means that NOR gate 32 necessarily outputs logic low as MCSNSOBB to inverter 33, which in turns inverts that to logic high as MCSNSOB to tri-state inverter 34. At this point, the tri-state inverter 34 will remain on due to INTCK being high, so will output logic low as SCSNSOBB to inverter 35, which will invert it as SCSNSOB to inverter 37, which in turn will pull the fault flag CSNO low at time t5 (due to propagation delay). Note that at this point, the tri-state inverter 36 will remain off due to the internal clock signal INTCK being at logic high.

At time t4, the internal clock signal INTCK falls. Here, since INTCK was immediately previously at logic high, NOR gate 32 will output logic low as MCSNSOBB, with the result being that NOR gate 31 will output logic high (since CKB is at logic low), maintaining the output of NOR gate 32 at the logic low. Since MCSNSOBB is at logic low, the inverter 33 will output MCSNSOB as logic high. SCSNSOBB at this point is at a logic low, and is flipped by inverter 35 to produce SCSNSOB as logic high, and flipped again by inverter 37 to generate the fault flag CSNO at logic low. Note that at this point, tri-state inverter 36 will turn on because the internal clock signal INTCK is at logic low and because MCSNSOB is at logic high.

At time t6, the external clock signal CK falls to logic low, with the result being that the tri-state inverter 34 is disabled, latching the fault flag CSNO at its current state. The tri-state inverter 34 is disabled at time t6 due to the clock inverse signal CKB rising to logic high when the external clock signal CK falls to logic low and due to the internal clock signal INTCK already being at logic low (having fallen to logic low at time t4). Also at this time, the tri-state inverter 36 is enabled, due to INTCK being low, latching the fault flag CSNO at its logic low value.

Note that the latching of the fault flag CSNO is not dependent on the external clock signal CK falling. If the external clock signal CK does not fall to logic low, this means that the clock inverse signal CKB remains at logic low. If CKB is logic low, the output of NOR gate 31 will be logic high, and since the internal clock signal INTCK will be logic low at this point, the output of NOR gate 32 will generate MCSNSOBB as a low, and inverter 33 will flip that to generate MCSNSOB to high. MCSNSOB being high while the internal clock signal INTCK is logic low will enable the tri-state inverter 36, latching the fault flag CSNO at its current state.

Since the fault flag CSNO is at logic low at time t6 when the latch 39 latches the fault flag CSNO, that logic low is latched, and indicates that no error was present during this cycle (which ended at time t6).

In this operation, it should be understood that the internal clock signal INTCK rising always results in the fault flag CSNO falling to logic low due to the logic of the fault detection circuit 30, eliminating the possibility of metastability or occurrence of a race condition.

A next cycle begins at time t6 and runs through time t10. As will be seen, in this cycle, an error occurs. Here, at time t7, a rising edge of the external clock signal CK occurs. The external clock signal CK being at logic high means that its inverse CKB will be at logic low.

Since the external clock signal CK was previously at logic low, this means that its inverse CKB was previously at logic high, meaning that NOR gate 31 will be outputting logic low when the external clock signal CK rises (and its inverse CKB falls) at time t7. The result is that NOR gate 32 outputs logic high as MCSNSOBB to inverter 33, and that the inverter 33 in turn outputs MCSNSOB at logic low.

Note that at this point, the tri-state inverter 34 will be enabled due to CKB being at logic low, and will output SCNSOBB at logic high. Also note that at this time, the tri-state inverter 36 will be disabled due to the clock inverse signal CKB and MCNSOB being at logic low.

SCNSOBB will be inverted by inverter 35, and then again by inverter 37 to produce a rising edge of the fault flag CSNO at time t9. The rising edge of the fault flag CSNO rises at time t9 due to propagation delay in the failure detection circuit 30.

As can be seen, at time t8, a rising edge of the internal clock signal INTCK should have occurred, but did not due to a single bit upset in the clock latch 40. Therefore, the logic state of the various components of the failure detection circuit 30 does not change until time t10. At time t10, the external clock signal CK falls (and its inverse CKB rises), yet the fault flag CSNO is at logic high, so the resulting disabling of the tri-state inverter 34 by the internal clock signal INTCK remaining low and the clock inverse signal CKB rising to logic high serves to latch the fault flag CSNO at logic high, indicating that a single bit upset has occurred in the clock latch 40. The clock inverse signal CKB rising to logic high and the internal clock signal INTCK remaining at logic low serve to turn on the tri-state inverter 36 at this point to maintain the fault flag CSNO at its current state.

Note that with an error in which the internal clock signal INTCK did rise, but insufficiently (e.g. the signal did not reach logic high before falling back to logic low), the operation and result would be the same as where the internal clock signal INTCK never rose.

Again note that the latching of the fault flag CSNO is not dependent on the external clock signal CK falling. If the external clock signal CK does not fall to logic low, this means that the clock inverse signal CKB remains at logic low. If CKB is logic low, the output of NOR gate 31 will be logic high, and since the internal clock signal INTCK will be logic low at this point, the output of NOR gate 32 will generate MCSNSOBB as a low, and inverter 33 will flip that to generate MCSNSOB to high. MCSNSOB being high while the internal clock signal INTCK is logic low will enable the tri-state inverter 36, latching the fault flag CSNO at its current state.

Failure Detection Circuit 30 Operation During Inactive Cycle of Self Timed Memory Detailed operation when the self-timed memory is an inactive cycle is now described with additional reference to the timing diagram of FIG. 9. A cycle during which no error occurs is shown between times t11-t14. As can be seen, the external clock signal CK rises to logic high at time t12. The external clock signal CK being at logic high means that CKB is at logic low.

Since the external clock signal CK was previously at logic low, this means that its inverse CKB was previously at logic high, meaning that NOR gate 31 will be outputting logic low when the external clock signal CK rises (and its inverse CKB falls) at time t12. The result is that NOR gate 32 outputs logic high as MCSNSOBB to inverter 33, and that the inverter 33 in turn outputs MCSNSOB at logic low.

Note that at this point, the tri-state inverter 34 will be enabled due to CKB being at logic low, and will output SCNSOBB at logic high. Also note that at this time, the tri-state inverter 36 will be disabled due to CKB and MCSNSOB being at logic low.

SCNSOBB will be inverted by inverter 35, and then again by inverter 37 to produce a rising edge of the fault flag CSNSO at time t13. The rising edge of the fault flag CSNSO rises at time t13 due to propagation delay in the failure detection circuit 30.

At time t14, the external clock signal CK falls (and its inverse CKB rises), yet the fault flag CSNSO is at logic high, so the resulting disabling of the tri-state inverter 34 by the internal clock signal INTCK remaining low and the clock inverse signal CKB rising to logic high serves to latch the fault flag CSNSO at logic high, indicating that a single bit upset has not occurred in the clock latch 40. At this time, the tri-state inverter 36 will be enabled due to INTCK being at logic low and CKB rising to logic high, maintaining the fault flag CSNSO at its current logic level. Again note that the latching of the fault flag CSNSO is not dependent on the external clock signal CK falling. If the external clock signal CK does not fall to logic low, this means that the clock inverse signal CKB remains at logic low. If CKB is logic low, the output of NOR gate 31 will be logic high, and since the internal clock signal INTCK will be logic low at this point, the output of NOR gate 32 will generate MCSNSOBB as a low, and inverter 33 will flip that to generate MCSNSOB to high. MCSNSOB being high while the internal clock signal INTCK is logic low will enable the tri-state inverter 36, latching the fault flag CSNSO at its current state.

Now, an inactive cycle during which an error occurs is shown between times t14 and t19. Since the external clock signal CK was previously at logic low, this means that CKB was previously at logic high, meaning that NOR gate 31 will be outputting logic low when the external clock signal CK rises (and its inverse CKB falls) at time t15. The result is that NOR gate 32 outputs logic high as MCSNSOBB to inverter 33, and that the inverter 33 in turn outputs MCSNSOB at logic low.

Note that at this point, the tri-state inverter 34 will be enabled due to CKB being at logic low, and will output SCNSOBB at logic high. Also at this point, the tri-state inverter 36 will be disabled due to MCSNSOB and CKB being at logic low.

SCNSOBB will be inverted by inverter 35, and then again by inverter 37 to maintain the logic high state of the fault flag CSNSO at time t15.

At time t16, the internal clock signal INTCK wrongly and spuriously rises due to a single bit error in the clock latch 40. Since the internal clock signal INTCK is now at logic high, NOR gate 32 will output logic low as MCSNSOBB. Therefore, the logic low represented by MCSNSOBB is inverted by inverter 33 to produce MCSNSOB, which in turn is inverted by tri-state inverter 34 to produce SCSNSOBB, which in turn is inverted by inverter 35 to produce SCSNSOB, which itself is then inverted by inverter 37 pull the output of the inverter 37 low, generating a falling edge of the fault flag CSNSO. Due to propagation delay, the falling edge of the fault flag CSNSO occurs at time t18.

At time t19, the external clock signal CK falls to logic low, with the result being that the tri-state inverter 34 is disabled, latching the fault flag CSNSO. The tri-state inverter 34 is disabled at time t19 due to the clock inverse signal CKB rising to logic high when the external clock signal CK falls to logic low and due to the internal clock signal INTCK already being at logic low (having fallen to logic low at time t17). Again note that the latching of the fault flag CSNSO is not dependent on the external clock signal CK falling. If the external clock signal CK does not fall to logic low, this means that the clock inverse signal CKB remains at logic low. If CKB is logic low, the output of NOR gate 31 will be logic high, and since the internal clock signal INTCK will be logic low at this point, the output of NOR gate 32 will generate MCSNSOBB as a low, and inverter 33 will flip that to generate MCSNSOB to high. MCSNSOB being high while the internal clock signal INTCK is logic low will enable the tri-state inverter 36, latching the fault flag CSNSO at its current state.

Since the fault flag CSNSO is at logic low at time t19 when the latch 39 latches the fault flag CSNSO, that logic low is latched, and indicates that single bit upset in the clock latch 40 error was present during this cycle (which ended at time t19). Also note that at this time, the tri-state inverter 36 will be enabled due to INTCK being at logic low and CKB rising to logic high, thereby maintaining the fault flag CSNSO at its existing value.

Therefore, through the use of the failure detection circuit 30, single bit upsets can be accurately determined, without the possibility for metastable conditions like in the prior art.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A failure determination circuit, comprising:
  a master and save latch arrangement configured, in an active mode, to:
    directly electrically receive an internal clock signal from a clock latch that is intended to rise in response to an external clock signal rising, wherein the internal clock signal is generated from the external clock signal;
    generate a rising edge of a fault flag signal in response to a rising edge of the external clock signal;
    generate a falling edge of the fault flag signal in response to a rising edge of the internal clock signal if the rising edge of the internal clock signal occurs;
    latch the fault flag signal in response to a falling edge of the internal clock signal; and
    wherein the latched fault flag signal indicates a single bit upset in the clock latch if the falling edge of the fault flag signal was not generated prior to latching.

2. The failure determination circuit of claim 1, wherein the master and slave latch arrangement is configured, in an inactive mode, to:
  generate a rising edge of a fault flag signal in response to a rising edge of the external clock signal;
  generate a falling edge of the fault flag signal in response to a rising edge of the internal clock signal if the rising edge of the internal clock signal occurs; and
  latch the fault flag signal in response to a falling edge of the internal clock signal if the rising edge of the internal clock signal occurred;
  wherein the latched fault flag signal indicates a single bit upset in the clock latch if the falling edge of the fault flag signal was generated prior to latching.

3. A failure determination circuit, comprising:
a master and save latch arrangement configured, in an active mode, to:
receive an internal clock signal from a clock latch that is intended to rise in response to an external clock signal rising, wherein the internal clock signal is generated from the external clock signal;
generate a rising edge of a fault flag signal in response to a rising edge of the external clock signal;
generate a falling edge of the fault flag signal in response to a rising edge of the internal clock signal if the rising edge of the internal clock signal occurs;
latch the fault flag signal in response to a falling edge of the internal clock signal; and
wherein the latched fault flag signal indicates a single bit upset in the clock latch if the falling edge of the fault flag signal was not generated prior to latching;
wherein the master and slave latch arrangement comprises:
a first latch having a first input receiving an inverse of the external clock signal, a second input receiving the internal clock signal, and an output;
an inverter coupled to the output of the first latch; and
a second latch having a non-inverting enable terminal receiving a signal based upon the inverse of the external clock signal and an inverse of the output of the first latch, an inverting enable terminal receiving a signal based upon the internal clock signal, an input coupled to receive output from the inverter, and an output.

4. The failure determination circuit of claim 3, wherein the first latch comprises a NOR logic circuit; and wherein the second latch comprises a NOT logic circuit.

5. The failure determination circuit of claim 3, wherein the second latch comprises:
a first tri-state inverter having an inverting enable terminal receiving the inverse of the external clock signal, a non-inverting enable terminal receiving the internal clock signal, and an input coupled to receive output from the inverter;
a first inverter having an input coupled to an output of the first tri-state inverter; and
a second tri-state inverter having an inverting enable terminal, a non-inverting enable terminal, an input coupled to an output of the first inverter, and an output coupled to the input of the first inverter.

6. The failure determination circuit of claim 5, wherein the second latch further comprises:
a PMOS transistor having a source coupled to a supply node, a drain coupled to the inverting enable terminal of the second tri-state inverter, and a gate coupled to the internal clock signal;
a first NMOS transistor having a drain coupled to the non-inverting enable terminal of the second tri-state inverter, a source coupled to ground, and a gate coupled to receive output from the inverter that receives output of the first latch;
a second NMOS transistor having a drain coupled to the non-inverting enable terminal of the second tri-state inverter, a source coupled to ground, and a gate coupled to the inverse of the external clock signal; and
an inverter receiving input from the first inverter and producing the fault flag signal at its output.

7. A failure determination circuit that detects a single bit upset in a clock latch, the clock latch receiving an external clock signal and generating an internal clock signal therefrom, the failure determination circuit comprising:
a first latch configured to generate a first signal at logic high when the internal clock signal is at logic low and the external clock signal is at logic high, and generate the first signal at logic low when the internal clock signal is at logic high; and
a second latch configured to generate a fault flag signal at logic high when the first signal is at logic high, generate the fault flag signal at logic low when the first signal is at logic low, and latch when the internal clock signal is at logic low;
wherein presence of a single bit upset in the clock latch is indicated by the fault flag signal being at logic high upon latching of the second latch and the clock latch being in an active mode; and
wherein presence of a single bit upset in the clock latch is indicated by the fault flag signal being at logic low upon latching of the second latch and the clock latch being in an inactive mode.

8. The failure determination circuit of claim 7, wherein the second latch comprises:
a first tri-state inverter having an inverting enable terminal receiving the inverse of the external clock signal, a non-inverting enable terminal receiving the internal clock signal, and an input coupled to receive an inverted version of the first signal;
a first inverter having an input coupled to an output of the first tri-state inverter;
a second tri-state inverter having an inverting enable terminal, a non-inverting enable terminal, an input coupled to an output of the first inverter, and an output coupled to the input of the first inverter;
a PMOS transistor having a source coupled to a supply node, a drain coupled to the inverting enable terminal of the second tri-state inverter, and a gate coupled to the internal clock signal;
a first NMOS transistor having a drain coupled to the non-inverting enable terminal of the second tri-state inverter, a source coupled to ground, and a gate coupled to receive output from the inverter that receives output of the first latch;
a second NMOS transistor having a drain coupled to the non-inverting enable terminal of the second tri-state inverter, a source coupled to ground, and a gate coupled to the inverse of the external clock signal; and
an inverter receiving input from the first inverter and producing the fault flag signal at its output.

9. The failure determination circuit of claim 8, wherein the first latch comprises:
first and second NOR gates;
wherein the first NOR gate has inputs coupled to the inverse of the external clock signal and to the output of the second NOR gate, and an output;
wherein the second NOR gate has inputs coupled to the internal clock signal and to the output of the first NOR gate, and an output; and
a third inverter coupled to receive input from the output of the second NOR gate and providing output to the second latch.

10. A failure determination circuit that detects a single bit upset in a clock latch, the clock latch receiving an external clock signal and generating an internal clock signal therefrom, the failure determination circuit, comprising:
a set-reset (SR) latch having a set input receiving an inverse of the external clock signal, a reset input receiving the internal clock signal, and an output;
an inverter coupled to the output of the SR latch; and a static latch having an inverting enable terminal receiving a signal based upon the inverse of the external clock signal and an inverse of the output of the SR latch, a non-inverting enable terminal receiving a signal based upon the internal clock signal, an input coupled to receive output from the inverter, and an output.

11. The failure determination circuit of claim 10 further comprising an inverter receiving input from the output of the static latch and producing a fault flag signal as output, wherein the fault flag signal is at logic high upon latching of the static latch and the clock latch is in an active mode indicates presence of a single bit upset in the clock latch, and wherein the fault flag signal is at logic low upon latching of the static latch and the clock latch is in an inactive mode indicates presence of a single bit upset in the clock latch.

12. The failure determination circuit of claim 10, wherein the SR latch is constructed from NOR logic.

13. The failure determination circuit of claim 10, wherein the static latch is constructed from NOT logic.

14. A circuit, comprising:
a first latch receiving as input an internal clock signal for a memory and an inverse of an external clock signal from which the internal clock signal was generated;
a first inverter having an input coupled to an output of the first latch;
a second latch comprising:
a first tri-state inverter having an inverting enable terminal receiving the inverse of the external clock signal, a non-inverting enable terminal receiving the internal clock signal, and an input coupled to an output of the first inverter;
a second inverter having an input coupled to an output of the first tri-state inverter;
a second tri-state inverter having an input coupled to an output of the second inverter and an output coupled to the input of the second inverter;
a PMOS transistor having a source coupled to a supply node, a drain coupled to an inverting enable terminal of the second tri-state inverter, and a gate coupled to the internal clock signal;
a first NMOS transistor having a drain coupled to a non-inverting enable terminal of the second tri-state inverter, a source coupled to ground, and a gate coupled to the output of the first inverter; and
a second NMOS transistor having a drain coupled to the non-inverting enable terminal of the second tri-state inverter, a source coupled to ground, and a gate coupled to the inverse of the external clock signal; and
a third inverter having an input coupled to the output of the second inverter and an output for the circuit.

15. The circuit of claim 14, wherein the first latch comprises:
first and second NOR gates;
wherein the first NOR gate has inputs coupled to the inverse of the external clock signal and to the output of the second NOR gate, and an output; and
wherein the second NOR gate has inputs coupled to the internal clock signal and to the output of the first NOR gate, and an output coupled to the input of the first inverter.

16. The circuit of claim 14, wherein the second tri-state inverter has an inverting enable terminal coupled to a second node and a non-inverting enable terminal coupled to a first node; wherein the second latch further comprises:
a first PMOS transistor having a source coupled to a power supply node, a drain coupled to the second node, and a gate coupled to receive the internal clock signal;
a first NMOS transistor having a drain coupled to the first node, a source coupled to ground, and a gate coupled to the output of the first inverter; and
a second NMOS transistor having a drain coupled to the first node, a source coupled to ground, and a gate coupled to receive the inverse of the external clock signal.

17. A method of determining presence of a single bit upset in a clock latch, the method, comprising:
directly electrically receiving a next rising edge of an external clock signal at the clock latch;
in response to the next rising edge of the external clock signal:
generating a rising edge of an internal clock signal from the external clock signal when the clock latch is in an active mode, and not generating a rising edge of the internal clock signal from the external clock signal when the clock latch is in an inactive mode; and
generating a rising edge of a fault flag signal;
in response to a rising edge of the internal clock signal if the rising edge of the internal clock signal occurs, generating a falling edge of the fault flag signal; and
latching the fault flag signal.

18. The method of claim 17, wherein the latched fault flag signal indicates a single bit upset in the clock latch if the falling edge of the fault flag signal was not generated prior to latching, if the clock latch is in the active mode.

19. The method of claim 17, wherein the latched fault flag signal indicates a single bit upset in the clock latch if the falling edge of the fault flag signal was generated prior to latching, if the clock latch is in the inactive mode.

20. A circuit, comprising:
a first latch receiving as input an internal clock signal for a memory and an inverse of an external clock signal from which an internal clock signal was generated;
a first inverter having an input coupled to an output of the first latch; and
a second latch comprising:
a first tri-state inverter having an inverting enable terminal receiving the inverse of the external clock signal, a non-inverting enable terminal receiving the internal clock signal, and an input coupled to an output of the first inverter;
a second inverter having an input coupled to an output of the first tri-state inverter;
a second tri-state inverter having an input coupled to an output of the second inverter and an output coupled to the input of the second inverter;
a first transistor having a first conduction terminal coupled to a supply node, a second conduction terminal coupled to an inverting enable terminal of the second tri-state inverter, and a control terminal coupled to the internal clock signal;
a second transistor having a first conduction terminal coupled to a non-inverting enable terminal of the second tri-state inverter, a second conduction terminal coupled to ground, and a control terminal coupled to the output of the first inverter; and
a third transistor having a first conduction terminal coupled to the non-inverting enable terminal of the second tri-state inverter, a second conduction terminal coupled to ground, and a control terminal coupled to the inverse of the external clock signal.

21. The circuit of claim 20, wherein the first latch comprises:
- first and second logic gates;
- wherein the first logic gate has inputs coupled to the inverse of the external clock signal and to the output of the second logic gate, and an output; and
- wherein the second logic gate has inputs coupled to the internal clock signal and to the output of the first logic gate, and an output coupled to the input of the first inverter.

22. The circuit of claim 20, wherein the second tri-state inverter has an inverting enable terminal coupled to a second node and a non-inverting enable terminal coupled to a first node; wherein the second latch further comprises:
- a fourth transistor having a second conduction terminal coupled to a power supply node, a first conduction terminal coupled to the second node, and a control terminal coupled to receive the internal clock signal;
- a fifth transistor having a first conduction terminal coupled to the first node, a second conduction terminal coupled to ground, and a control terminal coupled to the output of the first inverter; and
- a sixth transistor having a first conduction terminal coupled to the first node, a second conduction terminal coupled to ground, and a control terminal coupled to receive the inverse of the external clock signal.

23. The circuit of claim 20, further comprising a third inverter having an input coupled to the output of the second inverter and an output for the circuit.

24. A failure determination circuit, comprising:
- a clock latch comprising:
  - a NAND gate receiving as input an external clock signal, a reset signal, and output from a tri-state inverter, wherein the tri-state inverter has an input coupled to an output of the NAND gate and is clocked by the external clock signal, wherein the NAND gate is configured to generate an internal clock signal as rising in response to the external clock signal rising; and
- a master and save latch arrangement configured, in an active mode, to:
  - receive the internal clock signal from the clock latch;
  - generate a rising edge of a fault flag signal in response to a rising edge of the external clock signal;
  - generate a falling edge of the fault flag signal in response to a rising edge of the internal clock signal if the rising edge of the internal clock signal occurs;
  - latch the fault flag signal in response to a falling edge of the internal clock signal; and
  - wherein the latched fault flag signal indicates a single bit upset in the clock latch if the falling edge of the fault flag signal was not generated prior to latching.

25. The failure determination circuit of claim 24, wherein the master and slave latch arrangement is configured, in an inactive mode, to:
- generate a rising edge of a fault flag signal in response to a rising edge of the external clock signal;
- generate a falling edge of the fault flag signal in response to a rising edge of the internal clock signal if the rising edge of the internal clock signal occurs; and
- latch the fault flag signal in response to a falling edge of the internal clock signal if the rising edge of the internal clock signal occurred;
- wherein the latched fault flag signal indicates a single bit upset in the clock latch if the falling edge of the fault flag signal was generated prior to latching.

* * * * *